United States Patent [19]

Warenback et al.

[11] Patent Number: 4,867,631
[45] Date of Patent: Sep. 19, 1989

[54] SPATULA FOR WAFER TRANSPORT

[75] Inventors: Douglas H. Warenback, San Rafael; Josef T. Hoog, Novato, both of Calif.

[73] Assignee: Tegal Corporation, Petaluma, Calif.

[21] Appl. No.: 185,730

[22] Filed: Apr. 25, 1988

[51] Int. Cl.⁴ .............................................. B65G 65/04
[52] U.S. Cl. ................................. 414/786; 414/416; 414/749; 414/222; 414/785; 414/331
[58] Field of Search .............. 414/416, 403, 217, 225, 414/226, 222, 749, 750, 754, 757, 785, 787; 118/729, 730, 50, 500

[56] References Cited

U.S. PATENT DOCUMENTS

| | | | |
|---|---|---|---|
| 3,272,350 | 9/1966 | Pflaumer et al. | 414/416 |
| 4,002,254 | 11/1977 | Olofsen | 414/416 |
| 4,412,771 | 11/1983 | Gerlach et al. | 414/331 X |
| 4,433,951 | 2/1984 | Koch et al. | 414/217 |
| 4,465,416 | 8/1984 | Burkhalter et al. | 414/217 |
| 4,542,712 | 9/1985 | Sato et al. | 414/217 X |
| 4,558,984 | 12/1985 | Garrett | 414/331 X |
| 4,744,713 | 5/1988 | Hrovath | 414/222 |

FOREIGN PATENT DOCUMENTS

| | | | |
|---|---|---|---|
| 61076 | 5/1977 | Japan | 414/331 |
| 1442989 | 7/1976 | United Kingdom | 414/787 |

*Primary Examiner*—Frank E. Werner
*Attorney, Agent, or Firm*—Paul F. Wille

[57] ABSTRACT

In apparatus for transporting semiconductor wafers, a spatula contains a single major recess for receiving a wafer. Adjacent one edge of the recess is a shoulder for locating the wafer in the sequence of operations for loading the spatula. As a result of the sequence, the center of the wafer is held at a predetermined, known location.

2 Claims, 1 Drawing Sheet

SPATULA FOR WAFER TRANSPORT

BACKGROUND OF THE INVENTION

This invention relates to apparatus and a method for transporting wafers and, in particular relates to apparatus and method for maintaining the center of the wafers at a known location.

In transporting semiconductor wafers, or any other article not having a regular geometrical shape or a shape symmetrical about any line through its center, a problem arises in accurately locating a wafer. In transporting a wafer to a plasma reactor, for example, it is important that the wafer be accurately placed within the reactor so that any treatment of the wafer is carried out as uniformly as possible. If the wafer is off-center in the reactor, the yield of good die per wafer decreases, sometimes significantly.

One source of difficulty is the flat on the wafer which is used to indicate the crystallographic orientation of the wafer. As illustrated in FIG. 1, cassette 11 contains a plurality of wafers, such as wafer 13. Wafer 13 rests in the cassette with flat 14 facing away from the cassette. As thus positioned, center 15 of wafer 13 has the location indicated. Cassette 12 contains wafer 16. In this case, however, flat 17 of wafer 16 faces an interior portion of cassette 12, which results in center 18 being positioned as shown. A comparison of centers 15 and 18 reveals offset 19 between the location of the enters relative to the cassettes. On a four inch wafer, this offset can amount to as much as 2.3 millimeters. (While illustrated using separate cassettes, it is understood that this problem is also a variation in position of the wafers within a single cassette).

In the prior art, a variety of mechanisms have been employed to solve this problem. In general, they are directed at locating the flat and rotating the wafer to a predetermined orientation of the flat. These mechanisms are not only complex but they also tend to generate particles which could contaminate the wafer. An alternative has been to use a plurality of sensors and actuators to bring the wafer to a known location. This is also a complex mechanism.

In view of the foregoing, it is therefore an object of the present invention to provide simplified apparatus for repeatably locating the center of a wafer.

Another object of the present invention is to provide a method for locating the center of a wafer on a transfer spatula.

SUMMARY OF THE INVENTION

The foregoing objects are achieved in the present invention wherein a spatula capable of fitting within a cassette of wafers is provided with a primary recess and a secondary shoulder at the distal end of the spatula. A wafer is partially withdrawn from a cassette by engaging the wafer with the secondary shoulder. The direction of the spatula is reversed to engage the wafer with the primary recess. The motion of the spatula is again reversed and the wafer is fully withdrawn from the cassette with the center of the wafer at a known location on the spatula.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
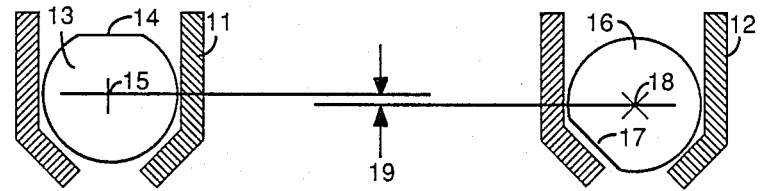
FIG. 1 illustrates the variation in location of wafer centers in a wafer cassette.

As previously described, FIG. 1 illustrates a comparison of the shift of the centers of wafers in a cassette. Specifically, when flat 17 of wafer 16 is oriented as illustrated, wafer 16 shifts to a lower position in cassette 12. In addition, since the wafers are not tightly held in a cassette, there may also be some slight side to side dislocation of the centers of the wafers.

Figure 2:
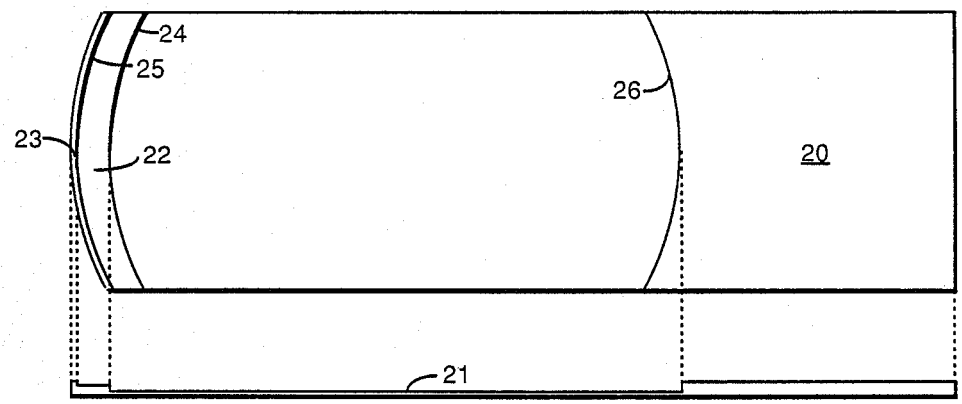
FIG. 2 illustrates a top and side view of a spatula in accordance with the present invention.

FIG. 2 illustrates a preferred embodiment of a platen or spatula in accordance with the present invention. Specifically, spatula 20 comprises a primary recess 21 formed in the free end of spatula 20. It is understood by those of skill in the art, that spatula 20 is connected to suitable transport means, not shown. Recess 21 is formed by a decreased thickness in spatula 20 and is bounded by curved edges 24 and 26, each of which has a radius slightly greater than the radius of the wafer to be transported. For example, in the case where spatula 20 is to be used to transport wafers having a diameter of one hundred millimeters, the radius of edges 24 and 26 preferably comprises 50.25 millimeters.

At the distal end of spatula 20, secondary shoulder 22 is formed adjacent primary recess 21. Shoulder 22 is bounded on one side by edge 24 and on the other side by edge 25. Edge 25 preferably comprises the same radius as edge 24 but displaced along a central axis of spatula 20. Shoulder 22 is actually also a recess in that it comprises a less thick portion of spatula 20 than either end. The outer most portion of spatula 20 comprises ridge 23 which extends above shoulder 22 and recess 21. In a preferred embodiment, edge 26 has the same height as edges 24 and 25 together so that the wafer is aligned with primary recess 21, as more fully described in conjunction with FIG. 5.

As illustrated in FIG. 1, and as well known to those of skill in the art, semiconductor wafers are provided with at least one flat, such as flats 14 and 17, to provide an indication of the crystallographic orientation of the wafer. Such flats can have various widths. The width of spatula 20 is greater than the width of the flat on the wafer to be transported, or is greater than the larger of the flats on a wafer if the wafer has more than one flat. This assures that edges 24, 25, and 26 will engage the wafer at the circumference thereof and not along a chord, i.e. the flat.

Figure 3:
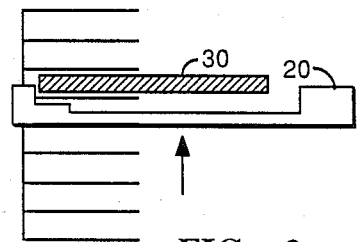
FIG. 3-6 illustrates the sequence of steps in locating a wafer accordance with the present invention.

FIG. 3 illustrates a first step in accordance with a preferred embodiment of the method of the present invention wherein spatula 20 is inserted into a cassette such that ridge 23 can engage the inside edge of the wafer (as seen from outside the cassette). Spatula 20 is inserted between the wafers and then moved in the direction indicated to engage wafer 30.

Figure 4:
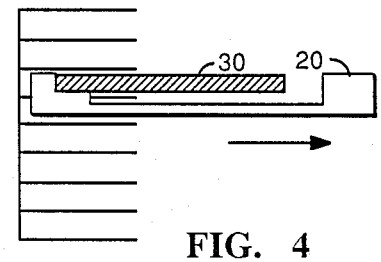

As illustrated in FIG. 4, spatula 20 is then withdrawn slightly to assure wafer 30 has engaged edge 25.

Figure 5:
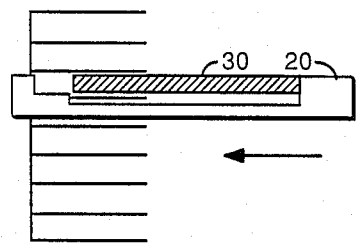

As illustrated in FIG. 5, spatula 20 is then reinserted into the cassette so that wafer 30 engages edge 26 of spatula 20. This now assures that wafer 30 is properly located with respect spatula 20 and that the center of wafer 30 is in a predetermined location.

Figure 6:
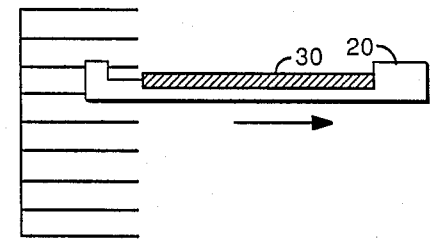

As illustrated in FIG. 6, spatula 20 is then raised to deposit wafer 30 within primary recess 21. Spatula 20 is then withdrawn from the cassette and the wafer transported to the next location. Typically this comprises a processing chamber in which it is important to accurately locate the wafer to assure uniform treatment of the surface of the wafer. This is especially so in the situation where the reactor processes wafers singly.

There is thus provided by the present invention and improved spatula for transporting wafers and a simplified technique for accurately locating the center of wafers to assure accurate placement. The present invention achieves these results with equipment that is much simpler than that and less expensive than that of the prior art. Particle generation is minimal because the wafer is not dragged along the spatula but merely gently moved by it by way of a light contact on the periphery of the wafer. The motion of the wafer is only slightly greater than would be necessary to simply remove the wafer from the cassette. This slight increase in motion does not produce a significant increase in particulars.

Having thus described the invention, it will be apparent to those of skill in the art that various modifications can be made within the scope of the present invention. For example, one could reverse the location of shoulder 22 and the subsequent motion to achieve the results of the present invention. Although it is much preferred that edges 24, 25, and 26 have the same radius and the arcs of circle, one could use other features lying in an arc approximating the radius of the wafer to be transported, so long as the space between such features was considerably smaller than the size of the flat. One can eliminate ridge 23 and make shoulder 22 of a non-abrasive material with high coefficient of friction with the wafers, e.g. polyimide or polyurethane. This enables one to carry out the process of FIGS. 3–6 with a thinner spatula.

We claim:

1. A method for accurately locating a wafer on a cantilever mounted spatula for transporting said wafer, said wafer resting in a horizontal position on a support and said spatula having an upwardly facing recess and a ridge forming a stepped shoulder on the outer edge of said recess, said method comprising the steps of:

placing said spatula underneath said wafer;

moving said spatula in a first direction to engage said wafer with said ridge;

moving said spatula in a second direction, opposite to said first direction, to contact said wafer with the inner edge of said recess;

raising said spatula to seat said wafer in said recess; and moving said spatula, with said wafer, in said first direction to remove said wafer from said support.

2. The method as set forth in claim 1, wherein said support comprises a cassette for carrying a plurality of wafers and said placing step comprises inserting said spatula between wafer locations in said cassette.

* * * * *